United States Patent [19]
Maeda

[11] Patent Number: 5,996,458
[45] Date of Patent: Dec. 7, 1999

[54] LEAD CUTTING APPARATUS OF ELECTRONIC COMPONENT

[75] Inventor: Masato Maeda, Tokyo, Japan

[73] Assignee: NEC Corporation, Tokyo, Japan

[21] Appl. No.: 08/947,588

[22] Filed: Oct. 9, 1997

[30] Foreign Application Priority Data

Oct. 9, 1996 [JP] Japan .................................. 8-268364

[51] Int. Cl.⁶ .................................................. H05K 3/30
[52] U.S. Cl. .............................. 83/456; 83/461; 83/465; 83/929.2; 83/942; 29/566.2; 29/566.3
[58] Field of Search ........................... 83/451, 452, 453, 83/455, 456, 460, 461, 465, 929.2, 942

[56] References Cited

U.S. PATENT DOCUMENTS

| | | | |
|---|---|---|---|
| 385,056 | 6/1888 | Jensen | 83/451 |
| 2,549,254 | 4/1951 | Smyth | 83/452 |
| 3,294,392 | 12/1966 | Dunham | 83/451 |
| 3,349,658 | 10/1967 | Johns et al. | 83/453 |
| 3,880,029 | 4/1975 | Bonaddio et al. | 83/451 |
| 4,184,472 | 1/1980 | Benedicto et al. | 83/451 |
| 4,911,046 | 3/1990 | Goss et al. | 83/929.2 |
| 4,946,149 | 8/1990 | Greene | 83/451 |

*Primary Examiner*—M. Rachuba
*Assistant Examiner*—Gyounghyun Bae

[57] ABSTRACT

A lead cutting apparatus of an electronic component, which is capable of cutting of leads of the component to a specific length independent of the shape and size of the component. This apparatus includes a table with a flat surface on which an electronic component is placed. The package of the component is supported by the flat surface of the table. A pair of cutting units are located at each side of the table. Each of the pair of cutting units has a gripper for gripping a corresponding one of the leads of the component, a cutter for cutting the corresponding one of the leads to a specific length, and a retainer for retaining the package of the component on the table. The pair of cutting units are designed to be moved toward the table and away from the table by a pair of moving units, respectively. The pair or cutting units are moved toward the table until the retainers are contacted with the package of the component by the pair of driving units, respectively, thereby positioning the component on the flat surface of the table. The grippers of the pair of cutting units are moved to grip the corresponding leads. The cutters of the pair of cutting units are moved to cut the gripped leads to the specific length.

4 Claims, 5 Drawing Sheets

LEAD CUTTING APPARATUS OF ELECTRONIC COMPONENT

BACKGROUND OF THE INVENTION

1. Field of the Invention

The present invention relates to a lead cutting apparatus of an electronic component and more particularly to a lead cutting apparatus of an electronic component such as a packaged integrated circuit (IC), in which the leads extending from each end of a package of the component are cut to a specific length.

2. Description of the Prior Art

In recent years, the semiconductor industry has been in the process of transition from the era of mass-production of a same product to the era of small-quantity production of various products with the progressing expansion and competition of purpose or use. Accordingly, there has been the increasing need of flexible manufacturing systems (FMSs) capable of the small-quantity production of various products in the manufacturing system field of semiconductor devices or ICs.

In a finishing process (for example, a lead cutting or lead forming process) of ICs, which is performed after an assembling process, a proper cutting or forming die has been usually used for enabling automatic cutting or formation of the leads of the IC. However, various products necessitate various sizes or lengths of the leads. As a result, to cope with the various lead sizes or lengths, a lot of dedicated dies need to be prepared in advance.

FIG. 1 shows an example of the conventional lead cutting apparatuses of an IC.

In FIG. 1, the conventional apparatus includes a table 104 on which a work piece or a packaged IC 111 is placed. The table 104 is fixed on a base 112. The IC 111 has an encapsulation package 110 and leads 110a protruding from each side or end of the package 110.

A hole 104a is formed in the top surface of the table 104. The hole 104a is designed to have a shape allowing the metal, plastic, or ceramic package 110 of the IC 111 to be fitted into the hole 104a. At this time, the horizontally-extending leads 110a of the IC 111 are outside the hole 104a.

A pair of punching units 107A and 107B are provided on the base 112 at each side of the table 104. The pair of punching units 107A and 107B serve to cut the leads 110a of the IC 111 to a specific desired length. The pair of punching units 107A and 1073 are horizontally movable toward the table 104 and away from the table 104 along horizontally-extending guides 121 that are fixed on the base 112. The movement of the pair of punching units 107A and 107B are realized by a pair of driving or moving mechanisms 103A and 103B, respectively. The pair of driving mechanisms 103A and 103B are provided in the vicinities of the pair of punching units 107A and 107B, respectively.

Since the pair of punching units 107A and 107B have the same configuration, the configuration of the unit 107A is explained here. The punching unit 107A has a gripper 106 formed by a movable gripping member 106a and a fixed gripping member 106b. The movable gripping member 106a is vertically movable along guides 122. The leads 110a of the IC 111 are sandwiched and positioned by the gripping members 10a and 106b. The punching unit 107A further has a punch 105 serving as a cutter for the leads 110a. The guide 122 may be omitted.

The movable gripping member 106a is moved by the combination of an electric motor 113, feed screws 118, and nuts 119. The motor 113 is fixed to the body of the punching unit 107A. The screws 118 are rotated by the motor 113. The nuts 119 are engaged with the corresponding screws 118. The vertical movement of the movable gripping member 106a is realized by rotation of the screws 118 generated by the motor 113.

Because the pair of driving mechanisms 103A and 103B have the same configuration, the configuration of the mechanism 103A is explained here. As seen from FIG. 1, the driving mechanism 103A has a feed screw 108 engaged with the body of the unit 107A and a motor 109 fixed onto the base 112. The screw 108 is rotated by the motor 109. The punching unit 107A is horizontally moved toward the table 104 and away from the table 104 by rotation of the screw 108.

The conventional lead cutting apparatus shown in FIG. 1 operates as follows.

First, the packaged IC 111 is positioned on the table 104 by fitting the package 110 into the hole 104a of the table 104. Next, the pair of punching units 107A and 107B are horizontally moved toward the table 104 by the pair of driving mechanisms 103A and 103B at specific distances, respectively. Thus, the punching units 107A and 107B are positioned at desired positions for preset specific lengths, respectively. At this stage, the leads 110a are located on the fixed gripping members 106b.

Subsequently, the movable gripping members 106a of the grippers 106 of the pair of punching units 107A and 107B are lowered toward the fixed gripping members 106b, thereby gripping the leads 110a of the IC 111 at each side of the table 104. Finally, the punches 105 of the punching units 107A and 107B are lowered to cut the gripped leads 110a to the desired length. These operation sequence is performed under the control of a programmed controller (not shown).

As described above, with the conventional lead cutting apparatus shown in FIG. 1, the leads 110a can be automatically cut to the desired specific length. However, the hole 104a of the table 104 is formed to be dedicated to the shape and size of the package 110 of the IC 111. Therefore, there is a problem that the conventional apparatus cannot be used for another IC with a different shape and/or a size.

To make it possible for the conventional apparatus to cut the leads of various ICs with different size and/or shapes, a lot of dedicated tables 104 having various holes 104a are necessarily prepared. Thus, there arises another problem that the number of the tables 104 increases and consequently, the initial and management costs are raised.

Especially, the sort of the ICs is frequently changed in the small-quantity production of various products. Accordingly, it takes a long time for set-up work such as table exchange and table centering, decreasing the operating efficiency of the apparatus.

Moreover, an automatic IC feeder is usually equipped with the lead cutting apparatus of this sort. In this case, the conventional apparatus necessitates the IC feeder an insertion behavior of the package 110 of the IC 111 into the hole 104a of the table 104. This behavior increases the cycle time.

SUMMARY OF THE INVENTION

Accordingly, an object of the present invention is to provide a lead cutting apparatus of an electronic component that is capable of cutting of leads of the component to a specific length independent of the shape and size of the component.

Another object of the present invention is to provide a lead cutting apparatus of an electronic component that decreases the cycle time of lead cutting operation.

The above objects together with others not specifically mentioned will become clear to those skilled in the art from the following description.

A lead cutting apparatus of an electronic component according to the present invention is comprised of a table with a flat surface on which an electronic component is placed. The component has a package and at least two leads protruding from each side of the package. The package of the component is supported by the flat surface of the table.

The apparatus further includes a pair of cutting units located at each side of the table. Each of the pair of cutting units has a gripper for gripping a corresponding one of the at least two leads, a cutter for cutting the corresponding one of the at least two leads to a specific length, and a retainer for retaining the package of the component on the table.

The pair of cutting units are designed to be moved toward the table and away from the table by a pair of moving units, respectively.

The pair of cutting units and the pair of moving units are controlled by a controller in the following way.

The pair of cutting units are moved toward the table until the retainers are contacted with the package of the component by the pair of driving units, respectively, thereby positioning the component on the flat surface of the table. The grippers of the pair of cutting units are moved to grip the corresponding leads. The cutters of the pair of cutting units are moved to cut the gripped leads to a specific length.

With the lead cutting apparatus according to the present invention, the electronic component is placed on the flat surface of the table and the package of the component is supported by the flat surface of the table. Further, the pair of cutting units located at each side of the table are moved by the pair of moving units until the retainers are contacted with the package of the component, respectively, thereby positioning the component on the flat surface of the table. Thereafter, the grippers are moved to grip the corresponding leads, and the cutters are moved to cut the gripped leads to a specific length, Consequently, the leads of the electronic component can be cut to the specific length independent of the shape and size of the IC.

As a result, the initial and management costs for the various tables are reduced and the time for set-up work such as table exchange and table centering is unnecessary. This decreases the cycle time of lead cutting operation and raises the operating efficiency of the apparatus.

In a preferred embodiment of the apparatus according to the present invention, a pressing unit is additionally provided for pressing the top of the package of the component placed on the table. There is an additional advantage that the positioning of the component is further ensured, because the component is held at the both sides and the top of the package.

In another preferred embodiment of the apparatus according the present invention, a vacuum suction unit is additionally provided in the table to vacuum-suck the package. There is an additional advantage that the positioning of the component is further ensured, because the component is not only retained by the retainers but also vacuum-sucked.

BRIEF DESCRIPTION OF THE DRAWINGS

In order that the present invention may be readily carried into effects it will now be described with reference to the accompanying drawings.

DETAILED DESCRIPTION OF THE PREFERRED EMBODIMENTS

Preferred embodiments of the present invention will be described below with reference to the drawings attached.

FIRST EMBODIMENT

Figure 2:
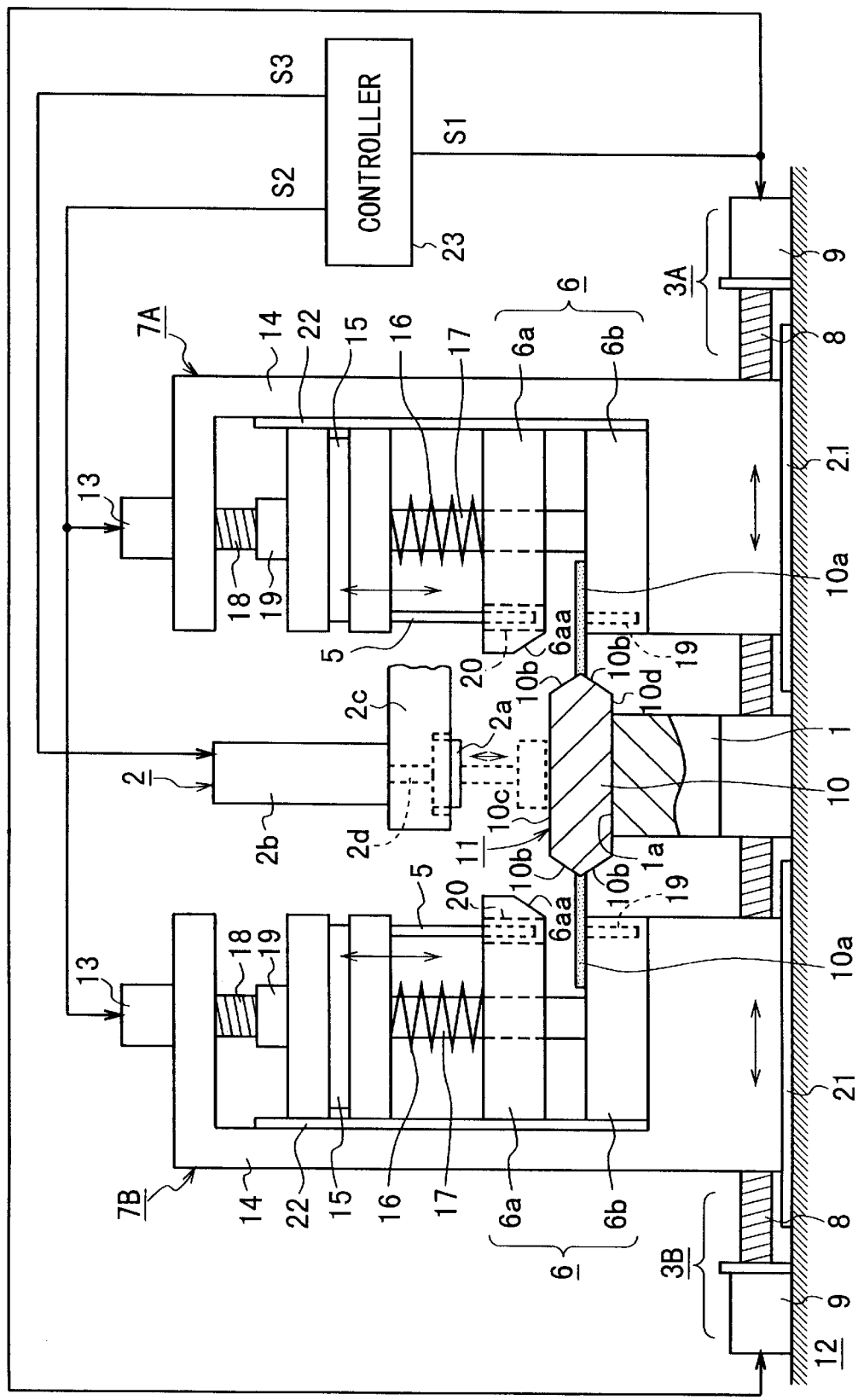
FIG. 2 is a schematic side view showing the configuration of a lead cutting apparatus of a packaged IC according to a first embodiment of the present invention.

A lead cutting apparatus of a packaged IC according to a first embodiment of the present invention is shown in FIG. 2.

As seen from FIG. 2, here, a packaged IC 11 has a rectangular plastic package 10 and metal leads 10a protruding from each side of the package 10. The package 10 has flat top and bottom surfaces 10c and 10d and oblique upper and lower side surfaces 10b.

The lead cutting apparatus according to the first embodiment is comprised of a table 1 with a flat top surface 1a on which an electronic component or IC 11 is placed or loaded. The table 1 is fixed on a base 12. The IC 11 is transferred by a popular automatic parts feeder (not shown). The bottom surface 10d of the package 10 is contacted with and supported by the flat surface 1a of the table 1.

A pressing unit 2 is provided for pressing the flat top surface 10c of the package 10 placed on the table 1. The unit 2 is located right over the table 1 . The unit 2 has a pad 2a, an elevating mechanism 2b, a supporting member 2c, and a guide shaft 2d. The pad 2a is movable along the vertical guide shaft 2d until it is contacted with the top surface 10c of the package 10 by the motion of the elevating mechanism 2b. The pressing unit 2 itself is supported by the supporting member 2c, as shown in FIG. 2. The pressing unit 2 may be formed, for example, by an air cylinder.

The apparatus further includes a pair of cutting units 7A and 7B located at each side of the table 1. Because, the units 7A and 7B have the same configuration, only the unit 7A is explained below.

The cutting unit 7A has a gripper 6 for gripping the opposing leads 10a of the package 10 and a punch 5 for cutting the opposing leads 10a to a specific length. The gripper 6 is formed by a movable gripping member 6a located in an upper level and a fixed gripping member 6b located in a lower level. The movable gripping member 6a is vertically movable along a vertical shaft 17 and a guide 22. A spring 16 serves to apply a pressing force to the upper member 6a. The leads 10a of the IC 11 are sandwiched and positioned by the gripping members 6a and 6b.

The movable gripping member 6a is driven or moved by the combination of an electric motor 13, vertical feed screws 13, and nuts 19. The motor 13 is fixed to the body of the Unit 7A. The nuts 19 are engaged with the corresponding screws 18, respectively. The vertical movement of the movable gripping member 6a is realized by rotation of the screws 18 generated by the motor 13.

The movable gripping member 6*a* has a retainer 6*aa* formed by an oblique face of the movable gripping member 6*b*. The retainer 6*aa* is designed to be contacted with the opposing upper side surface 10*b* of the package 10.

The retainer may be provided separately from the gripping member 6.

The pair of punching units 7A and 7B are designed to be horizontally moved toward the table 1 and away from the table 1 along guides 21 by a pair of moving units 3A and 3B, respectively. The guides 21 are fixed onto the base 12 by a pair of driving mechanisms 3A and 33.

The driving mechanism 3A includes a feed screw 8 and a motor 9. The motor 9 is fixed to the base 12. The screw 8 is engaged with the body of the corresponding punching unit 7A. The mechanism 3A horizontally moves the punching unit 7A along the guides 21 due to the rotation of the screw 8.

The driving mechanism 35 has the same configuration as that of the driving mechanism 3A.

The pair of punching units 7A and 7B, the pair of moving units 3A and 3B, and the pressing unit 2 are controlled by a controller 23 in the following way.

The pair of punching units 7A and 7B are moved toward the table 1 until the retainers 6*aa* are contacted with the opposing oblique surfaces 10*b* of the package 10 of the IC 11 by the pair of driving units 3A and 3B through an electric signal S1, respectively. Thus, the IC 1 is positioned on the flat surface 1*a* of the table 1.

The grippers 6 of the pair of punching units 7A and 7B are moved to grip or sandwich the corresponding leads 10*a* through an electric signal S2. The punches 5 of the pair of punching units 7A and 7B are moved to cut the gripped leads 10*a* to a specific length through the electric signal S2. A pressing unit 2 is lowered and raised through an electric signal S3.

The flat surface 1*a* of the table 1 is in a same level as that of a rail plane of the automatic parts feeder. Therefore, the IC 11 transferred through the feeder may be placed or loaded on the flat surface 1*a* of the table 1 by a single feeding behavior of a pusher cylinder (not shown).

The controller 23 has a program sequencer (not shown) for performing the whole cutting operation of the apparatus. Specifically, the sequencer includes various programs for the positioning behavior of the IC 11 on the table 1, the elevation behavior of the pad 2*a* of the pressing unit 2 and the punching behavior of the punches 5, the gripping behavior of the grippers 6, the moving behavior of the punching units 7A and 7B.

Next, the cutting operation of the apparatus according to the first embodiment is explained below with reference to FIGS. 3A to 3D.

Figure 3A:
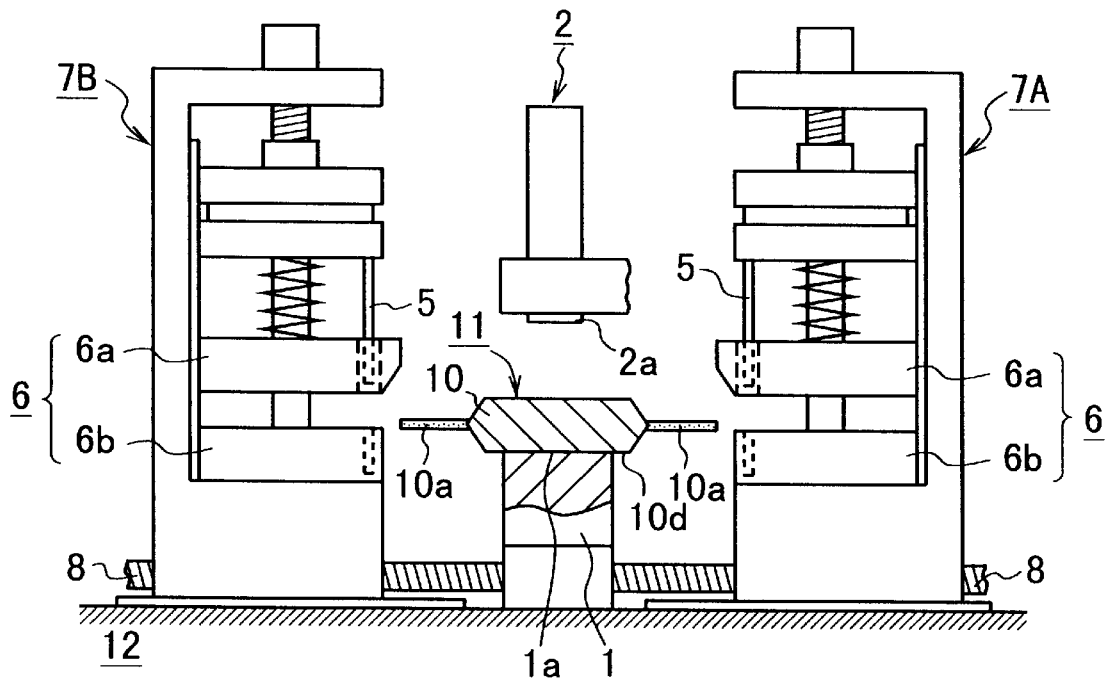
FIGS. 3A to 3D are schematic side views of the lead cutting apparatus according to the first embodiment of the present invention, respectively, which shows the lead cutting operation sequence thereof.

First, as shown in FIG. 3A, the IC 11, which has been transferred in a direction perpendicular to this paper, is loaded on the flat surface 1*a* of the table 1 by the pusher cylinder of the automatic part feeder. At this stage, the pair of the punching units 7A and 7B are apart from the table 1 so that the units 7A and 7B are not contacted with the horizontally extending leads 10*a* of the IC 11.

Figure 3B:
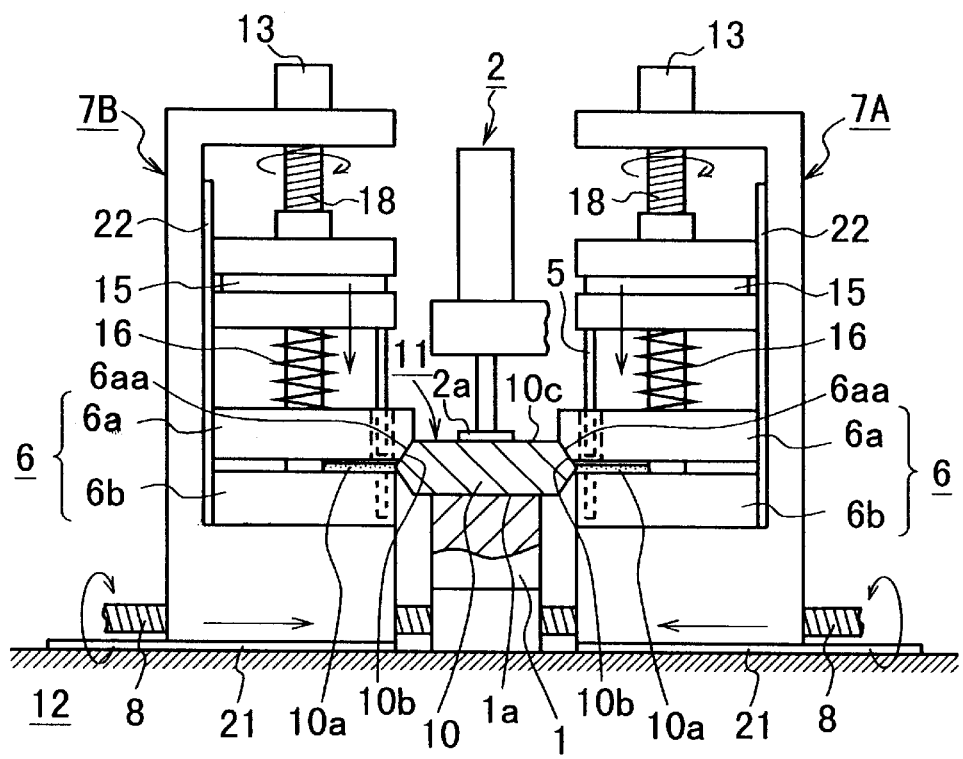

Second, as shown in FIG. 3B, the grippers 6 of the punching units 7A and 7B are lowered to the vicinity of the leads 10*a* of the IC 11 by the rotation of the motors 13 through the feed screws 18. At this stage, the grippers 6 are not contacted with the leads 10*a*.

Third, the driving units 3A and 3B are operated to horizontally and synchronously move the punching units 7A and 7B toward the table 1 until the retainers 6*aa* of the movable gripping members 6*a* are contacted with the opposing oblique side surfaces 10*b* of the package 10. Thus, the positioning of the package 10 is completed.

The package 10 have the upper and lower oblique side surfaces 10*b* for the purpose of detachment from a molding die set for the plastic package. Therefore, it is preferred that the oblique side surfaces 10*b* are the same in oblique angle as that of the opposing retainer surfaces 6*aa*. In this case, a downward pressing force is generated and applied to the package 10 without any other mechanism and therefore, the need of pressing the package 10 with the pad 2 (i.e., the pressing unit 2 itself) is omitted. However, the package 10 does not always have a oblique surface. Thus, it is preferred that the pressing unit 2 is equipped to cope such a rare case.

Figure 3C:
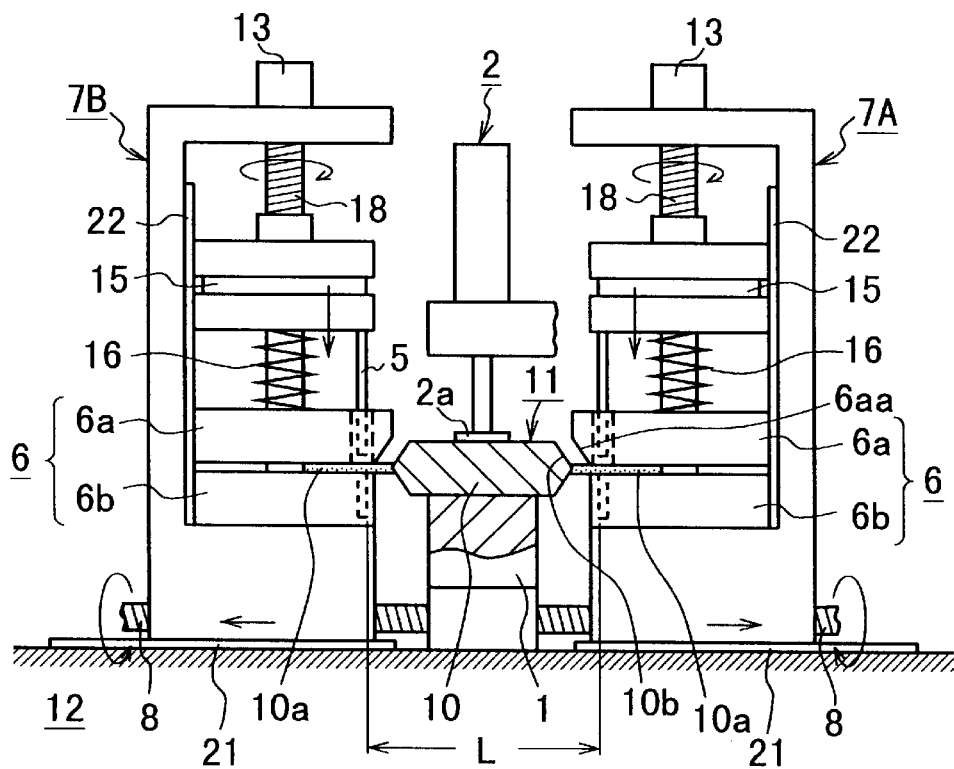

Further, as shown in FIG. 3C, the pairs of the punching units 7A and 7B are horizontally moved away from the table 1 by a distance corresponding to the necessary lengths of the leads 10*a*. Then, the motors 13 are activated to lower the grippers 6 toward the package 10, thereby gripping the leads 10*a* at each side of the package 10.

Figure 3D:
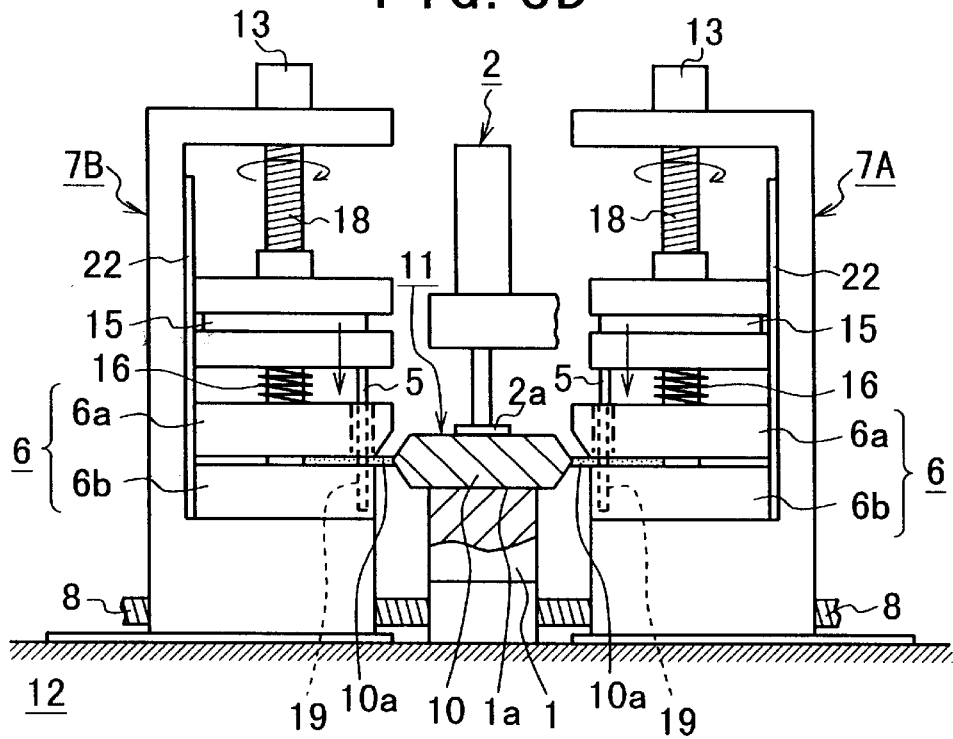

Finally, as shown in FIG. 3D, the punches 5 of the pair of punch units 7A and 7B are lowered to cut the leads 10*a* to the desired length. Thus, the whole process steps are finished for the leads 10*a*.

For the purpose of a next cutting operation, the pad 2*a* is come back to the upper position from the lower position, as shown in FIG. 3A. the punch units 7A and 7B are moved away from the table 1 to the original position. The remaining IC 11 thus lead-finished on the table 1 is transferred to an unloading shooter (not shown).

The same process step sequence as above are repeated as necessary. If the length of the leads 10*a* are changed, the program stored in the program sequencer is exchanged to a new one to vary the cutting length.

Figure 1:
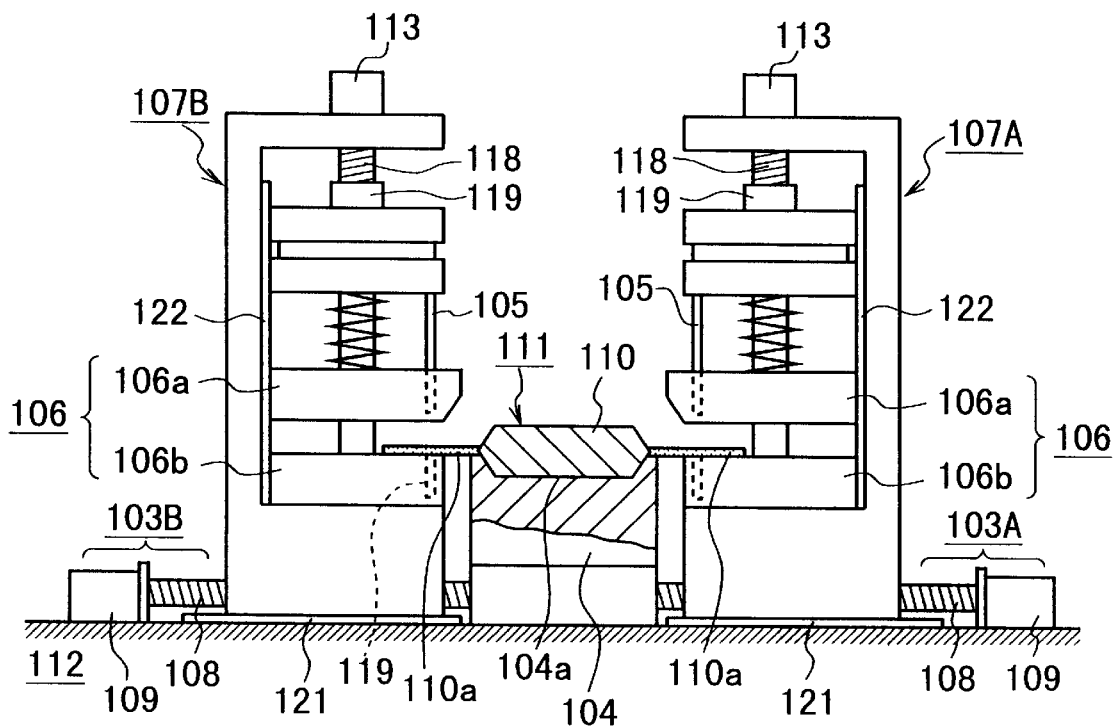
FIG. 1 is a schematic side view showing the configuration of a conventional lead cutting apparatus of a packaged IC.

With the lead cutting apparatus shown in FIG. 1, first, the packaged IC 11 is placed on the flat surface of the table 1 and the package of the ICs 11 is supported by the flat surface of the table. Further, the pair of cutting units 7A and 7B located at each side of the table 1 are moved by the pair of driving units 8 until the retainers 6*aa* are contacted with the package 10 of the IC 11, respectively, thereby positioning the IC 11 on the flat surface 1*a* of the table 1. Thereafter, the grippers 6 are moved to grip the corresponding leads 10*a*, and the cutters are moved to cut the gripped leads 10*a* to a specific length.

Consequently, the leads 11 of the IC 11 can be cut to a specific length independent of the shape and size of the IC As a result, the initial and management costs are reduced and the time for set-up work such as table exchange and table centering is unnecessary. This decreases the cycle time of lead cutting operation and raises the operating efficiency of the apparatus.

Additionally, no cutting die is necessary.

SECOND EMBODIMENT

Figure 4:
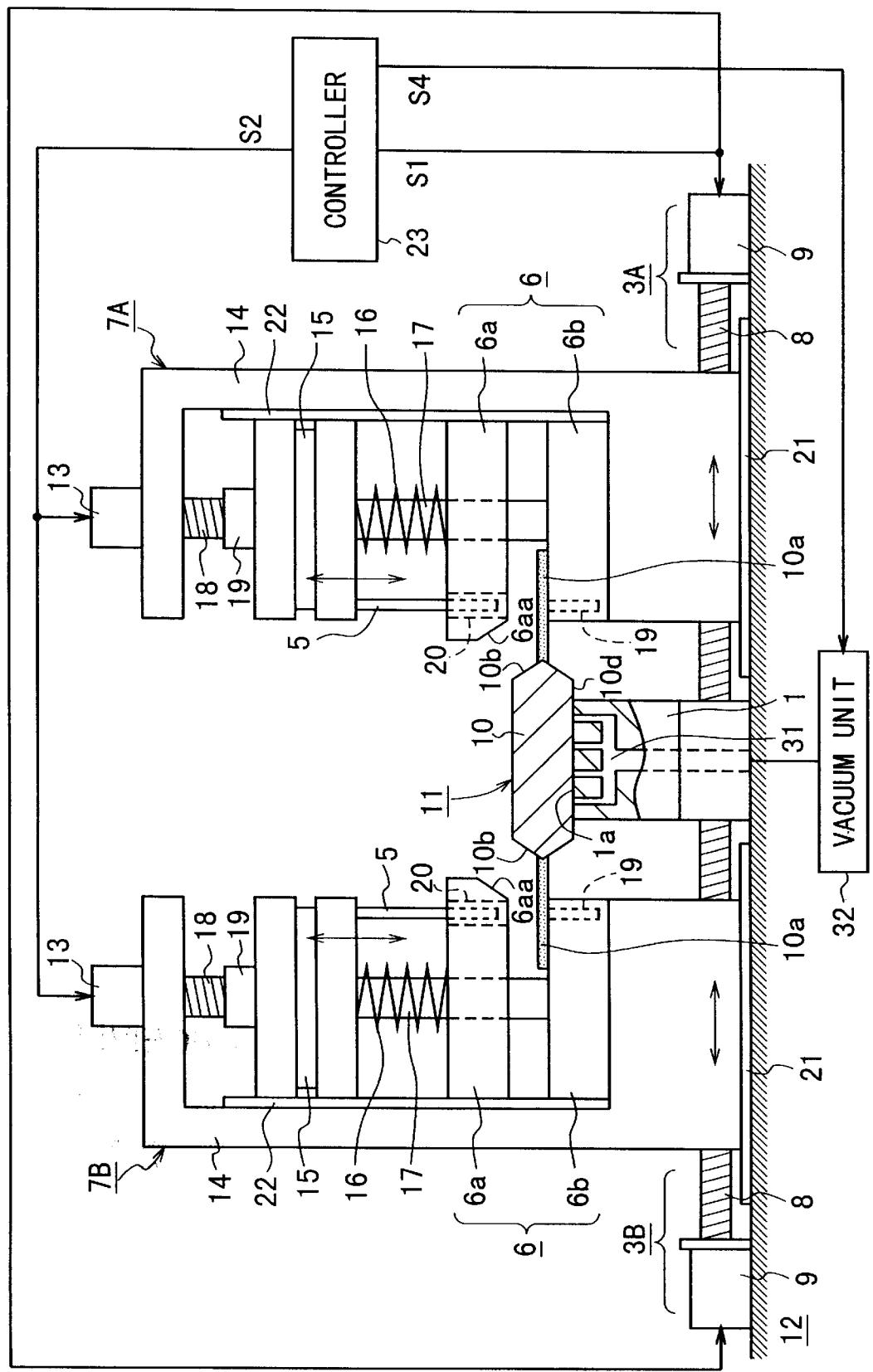
FIG. 4 is a schematic side view showing the configuration of a lead cutting apparatus of a packaged IC according to a second embodiment of the present invention.

A lead cutting apparatus according to a second embodiment of the present invention is shown in FIG. 4. This apparatus has the same configuration as that of the first embodiment in FIG. 2, except that pumping holes 31 are formed in the table 1 and a vacuum suction unit 32 is provided outside the apparatus and that the pressing unit 2 is omitted.

Therefore, the description about the same configuration is omitted here by attaching the same reference numerals to the same or corresponding elements for the sake of simplification.

Because the apparatus according to the second embodiment has the same basic configuration as that of the first embodiment, the same advantage as that of the apparatus in FIG. 4 is obtained. In this case, there is an additional advantage that the positioning of the IC 11 is further ensured, because the component is not only retained by the retainers but also vacuum-sucked.

In the above first and second embodiments, an IC with a plastic package is used as the work piece. However, it is needless to say that any other electronic component may be used for the present invention.

It is preferred that the package of an IC has flat top and bottom surfaces. However, any other IC with non-flat top and bottom surfaces may be used if the IC can be held by the use of the pressing unit 2 or the vacuum unit 32.

While the preferred forms of the present invention has been described, it is to be understood that modifications will be apparent to those skilled in the art without departing from the spirit of the invention. The scope of the invention, therefore, is to be determined solely by the following claims.

What is claimed is:

1. A lead cutting apparatus applicable to electronic components having different-shaped packages, each package of said components having at least two leads protruding from each side of said package and each package having a flat bottom surface, said apparatus comprising:

a table with a flat top surface for placement thereon of said electronic component with only said bottom surface of said package being in contact and constrained vertically by said table top surface;

a pair of cutting units located respectively at each side of said table, each of said cutting units having:

a gripper for gripping at least one of said leads, a cutter for cutting said at least one of said leads to a specific length, and said gripper having retainer means for at least temporarily positioning and retaining said package on said table top surface by application of lateral and vertical force on said package;

means for moving said pair of cutting units toward said table and away from said table and for positioning said cutters and retainer means;

a controller for controlling said pair of cutting units and said means for moving;

wherein in use of said apparatus said means for moving moves said pair of cutting units toward said table until said retainer means contact said package of said component and position said component on said top flat surface of said table.

2. An apparatus as claimed in claim 1, further comprising a pressing unit for pressing against said table said package of said component placed on said table.

3. An apparatus as claimed in claim 1, further comprising a vacuum suction unit in said table to vacuum-suck toward said table said package placed on said table.

4. An apparatus as claimed in claim 1, wherein said gripper and said retainer means are integral.

* * * * *